(12) United States Patent
Tsurumi et al.

(10) Patent No.: US 6,334,051 B1
(45) Date of Patent: Dec. 25, 2001

(54) DIRECT CONVERSION RECEIVER WITH WIDE BAND ANALOG FREQUENCY CONVERSION FRONT END AND DIGITAL DEMODULATING AND SELECTING BACK END

(75) Inventors: Hiroshi Tsurumi, Kawasaki; Hiroshi Yoshida, Yokohama, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/262,104

(22) Filed: Mar. 4, 1999

(30) Foreign Application Priority Data

Mar. 4, 1998 (JP) .................................. 10-052168
Jul. 7, 1998 (JP) .................................. 10-191718

(51) Int. Cl.$^7$ ...................................... H04B 1/26
(52) U.S. Cl. ........................................ 455/324; 375/316
(58) Field of Search .................... 455/310, 311, 455/324, 323; 375/316

(56) References Cited

U.S. PATENT DOCUMENTS

| 4,653,117 | 3/1987 | Heck | 455/209 |
| 4,893,316 | * | 1/1990 | Janc | 375/44 |
| 5,903,825 | * | 5/1999 | Goode | 455/205 |
| 6,073,000 | * | 6/2000 | Shinohara | 455/310 |
| 6,134,430 | * | 10/2000 | Younis | 455/340 |

FOREIGN PATENT DOCUMENTS 59-196629   11/1984   (JP) .

* cited by examiner

*Primary Examiner*—Daniel Hunter
*Assistant Examiner*—Nick Corsaro
(74) *Attorney, Agent, or Firm*—Oblon, Spivak, McClelland, Maier & Neustadt, P.C.

(57) ABSTRACT

A radio-frequency signal receive section, including an antenna, collectively receives radio-frequency signals on a plurality of channels each of which is modulated with data and outputs a received signal. In a quadrature demodulator, the received signal is multiplied by each of first quadrature local signals to produce quadrature baseband signals. In two low-pass filters, low-frequency component signals are extracted from the quadrature baseband signals. In a quadrature modulator, the low-frequency component signals are multiplied by second quadrature local signals and thereby converted into quadrature intermediate-frequency signals, which are in turn combined into an output signal. After converted into a digital signal, the output signal of the quadrature modulator is inputted to a digital signal processing unit where a signal on at least one channel is selected and the selected signal is processed to recover the original data.

10 Claims, 7 Drawing Sheets

DIRECT CONVERSION RECEIVER WITH WIDE BAND ANALOG FREQUENCY CONVERSION FRONT END AND DIGITAL DEMODULATING AND SELECTING BACK END

BACKGROUND OF THE INVENTION

The present invention relates to a receiver that is adaptable to a plurality of radio communication systems and more specifically to a receiver that collectively receives signals within the overall system band, selects a desired channel, and recovers original data transmitted on the selected channel.

In a communications environment in which there exist a plurality of radio communication systems that differ in frequency or band used, each radio terminal is required to have the ability to accommodate communications of the respective radio communication systems with a single receiver unit. From the following reasons it is difficult for conventional superheterodyne receivers to meet such a requirement with their practical arrangement.

In the superheterodyne receivers, a received signal from an antenna has an image-frequency signal eliminated therefrom and is then converted into a first intermediate-frequency signal. The first intermediate-frequency signal has an image-frequency signal eliminated again and is then converted into a second intermediate-frequency signal that is enough lower in frequency than the first intermediate-frequency signal. A signal on a desired channel is selected from the second intermediate-frequency signal and then demodulated. Where the received signal is an FM (frequency modulated), the second intermediate-frequency signal is subjected to amplitude limitation in an amplitude limiter and then applied to a frequency discriminator where the received signal is demodulated.

In the receiver thus arranged, an image suppression filter and a channel selection filter are used each of which consists of a passive filter such as a surface acoustic filter or a ceramic filter. The passive filter has great physical dimensions and moreover is costly, which prevents the downsizing and the cost reduction of the radio-frequency circuitry. In the passive filter, the central frequency and the bandwidth of the passband are usually fixed, and it is therefore difficult to make the central frequency and the bandwidth variable. In order for a radio terminal to receive simultaneously transmitted signals in multiple radio communication systems that differ in frequency and bandwidth, it is required to install a passive filter for each system. This cannot be granted from the viewpoint of any of physical dimensions and cost.

As a reception system that solves these problems, attention is paid to a direct conversion system. In a direct conversion receiver, a received signal from an antenna is fed into a quadrature demodulator, which, in two mixers, multiplies the received signal by two local signals that have substantially the same frequency as the received signal and are 90 degrees ($\pi/2$) out of phase with each other to thereby convert the received signal into two baseband signals having a 90-degree phase difference. The baseband signals are then applied to low-pass filters to select a signal on a desired channel.

FIG. 12 shows the manner in which a desired channel is selected. A signal on the desired channel is converted into zero frequency (DC) and then fed into a low-pass filter which eliminates other channels and interferential waves. The signal on the selected channel is amplified and then converted into a digital signal by an analog-to-digital converter. The digital signal is then applied to a digital signal processing section where original data is recovered.

In the direct conversion receiver, a received signal is directly converted into a baseband signal; thus, in principle there exists no image interference resulting from intermediate-frequency conversion. Accordingly, there is no need for an image suppression filter, consisting of a passive filter, that is essential to superheterodyne receivers. The channel selective low-pass filter can be implemented by an LSI. Thus, a broadband receiver can be implemented which does not require a separate device for each different radio communication system and is adaptable to a plurality of radio communication systems.

However, the direct conversion receiver requires to use inevitably the baseband demodulation as described above with resulting lack of flexibility. To overcome such a drawback, there have been proposals for signal processing systems which involve quadrature demodulation of a received signal and intermediate-frequency conversion of the demodulated signal, as described in Japanese Unexamined Patent Publications No. 59-196629 (FM RECEIVER) by way of example.

An attempt to arrange the receivers disclosed in the above publication so that they can accommodate a plurality of radio communication systems encounters the following problems. First, with the channel selective low-pass filter, it is required to make the passband variable over a wide range so that a selection can be made from channels including from a narrowband signal to a broadband signal over the overall system band. Further, in order for the filter to have the channel selecting function, it is required to use a very sharp high-order filter. On the other hand, the local oscillator in the quadrature demodulator is required to be capable of setting its oscillation frequency so as to accommodate all the radio communication systems that differ in channel spacing.

Thus, a severe burden is imposed on the performance of an analog circuit section in order to allow the arrangements as disclosed in the above-described publications to accommodate a plurality of radio communication systems. In general, in comparison with digital circuits, analog circuits have a large variability of characteristics and their characteristics are liable to vary with temperature and aging. To improve the performance and stability of receivers, therefore, it is not advisable to impose a burden on the performance of an analog circuit.

BRIEF SUMMARY OF THE INVENTION

It is an object of the present invention to provide a receiver which requires fewer components in a radio-frequency circuit section and is flexibly adaptable to a plurality of radio communication systems different in frequency and band by making use of digital signal processing without imposing a severe burden on the performance of local oscillators and filters each of which consists of an analog circuit.

The object of the present invention is achieved by a direct conversion type of receiver that is adapted to collectively convert radio-frequency received signals on a plurality of channels into a baseband signal, and select a signal on a desired channel from the baseband signal and recover data from the selected signal through digital signal processing.

According to a receiver of the present invention, radio-frequency signals on a plurality of channels, each of which is modulated with data, are collectively received as one wideband signal. The received signal is inputted to a quadrature demodulator, which multiplies the received signal by each of quadrature local signals to produce quadrature baseband signals. The resulting quadrature baseband signals are entered through first and second low-pass filters into a quadrature modulator. The first and second filters are intended to reject interferential components contained in the quadrature baseband signals and prevent the occurrence of aliasing due to sampling in a succeeding A/D converter or converters (i.e., anti-aliasing). The anti-aliasing is to remove frequency components of twice or more the sampling frequency in the succeeding A/D converter so as to prevent the occurrence of aliasing due to sampling in the A/D converter.

In the quadrature modulator, the output signals of the first and second low-pass filters are multiplied by first quadrature local signals and thereby converted into quadrature intermediate-frequency signals, and the quadrature intermediate-frequency signals are combined into one output signal. The output signal of the quadrature modulator is converted into a digital signal by an A/D converter and then entered into a digital signal processing unit, which selects a signal on at least one channel from the digital signal and then processes the selected signal to recover the original data.

According to another receiver of the present invention, first and second baseband signals from a quadrature demodulator are applied through first and second low-pass filters, respectively, to a quadrature modulator where they are converted into quadrature intermediate-frequency signals. By at least one A/D converter, the quadrature intermediate-frequency signals are converted into a digital signal, which is in turn applied to a digital downconverter. In the digital converter, the input digital signal is multiplied by quadrature clock signals to produce quadrature digital signals and a signal on at least one channel is selected from the quadrature digital signals by digital filters. A digital signal processing unit processes the output signal of the digital downconverter to recover the original data.

According to still another receiver of the present invention, the received signal, after being directly converted into a digital signal by an A/D converter, is applied to a digital downconverter which is the same as above. The output signal of the digital downconverter is processed by a digital signal processing unit to recover the original data.

According to a further receiver of the present invention, quadrature baseband signals from a quadrature demodulator applied through first and second low-pass filters to at least one A/D converter where they are converted into digital signals. The resulting digital signals are inputted to a digital quadrature modulator where they are converted into quadrature intermediate-frequency signals through digital processing. The quadrature digital intermediate-frequency signals are applied to a digital downconverter the output signal of which is processed by a digital signal processing unit to recover the original data.

According to another receiver of the present invention, quadrature baseband signals from a quadrature demodulator are applied through first and second low-pass filters to at least one A/D converter where they are converted into digital signals. The digital signals are applied directly to a digital downconverter with no intervening digital quadrature modulator. In the digital downconverter, the digital signals from the A/D converter are multiplied by a common reference clock signal into quadrature digital signals and a signal on at least one channel is selected from each of the quadrature digital signals and then outputted. The output signals of the digital downconverter are processed by a digital signal processing unit to recover the original data.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

[First Embodiment]

Figure 1:
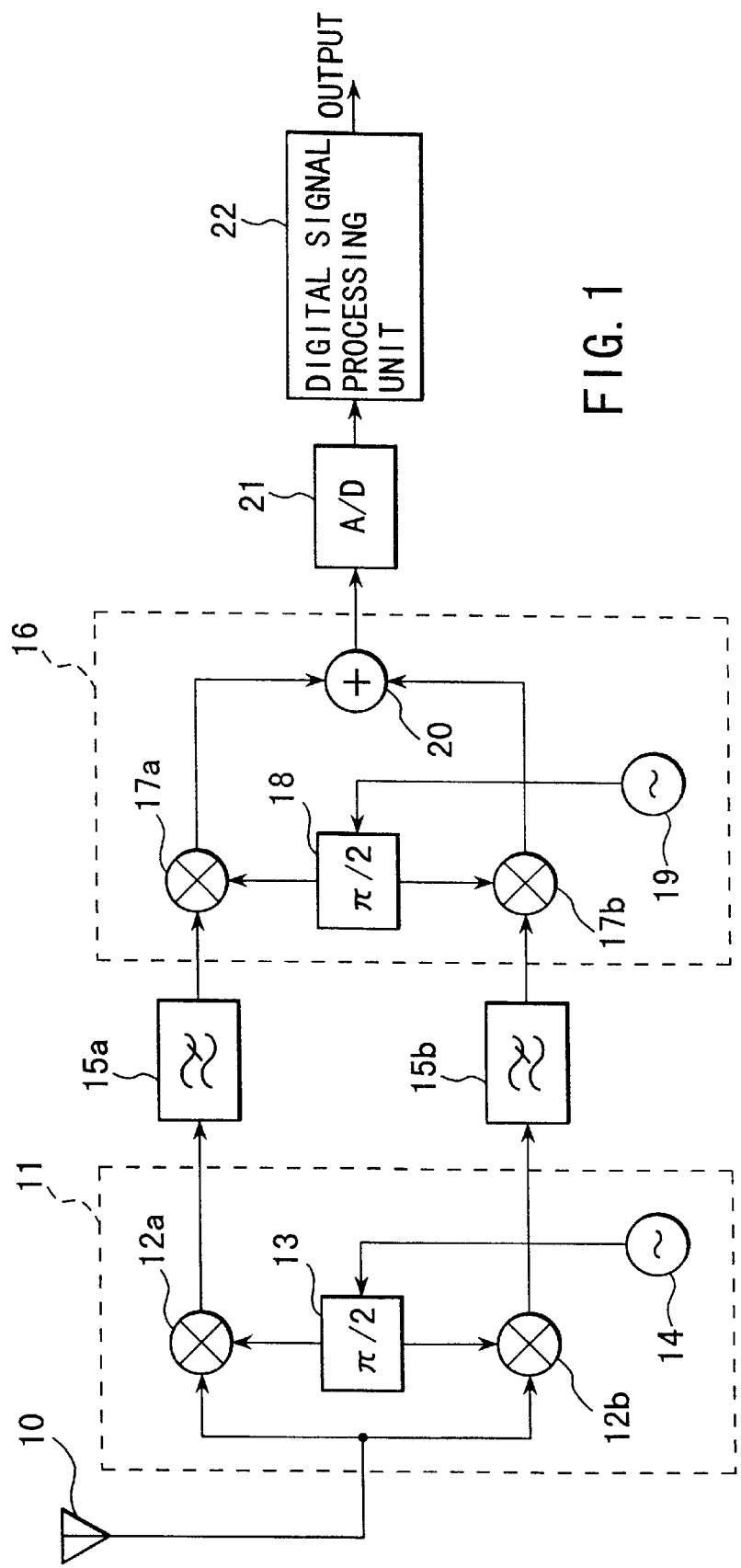
FIG. 1 is a block diagram of a receiver according to a first embodiment of the present invention.

Referring now to FIG. 1, a receiver is constructed from an antenna 10, a quadrature demodulator 11, low-pass filters 15a and 15b, a quadrature modulator 16, an A/D converter 21, and a digital signal processing unit 22. The quadrature demodulator 11 comprises mixers 12a and 12b, a π/2-phase shifter 13, and a local oscillator 14. The quadrature modulator 16 comprises mixers 17a and 17b, a π/2-phase shifter 18, a local oscillator 1, and an adder 20. In practice, various amplifiers are provided in this receiver. However, since these amplifiers are not essential components, their illustration and description are omitted herein. This is the case with the other embodiments.

Figure 2:
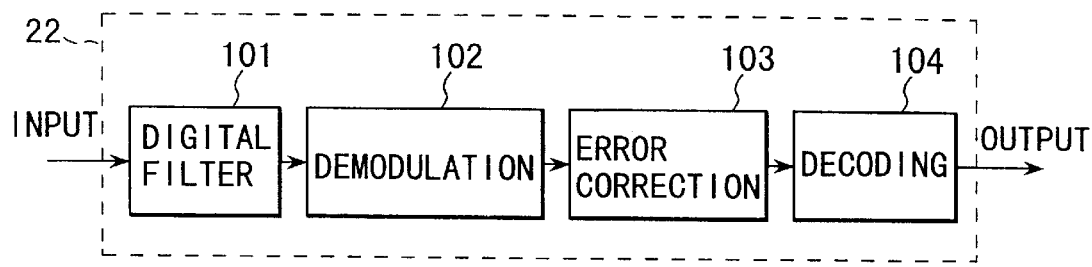
FIG. 2 is a block diagram of the digital signal processing section of FIG. 1.

As shown in FIG. 2, the digital signal processing unit 22 has a digital filter 101, a demodulation section 102, an error correction section 103, and a decoding section 104. This digital signal processing unit may be implemented either in hardware or software. For software implementation of the digital signal processing unit, a digital signal processor (DSP) is used.

Next, reference will be made to FIGS. 3, 4, and 5 to describe the operation of the receiver of the first embodiment.

The antenna 10 collectively receives radio-frequency signals modulated by original data and transmitted on channels in different radio communication systems and outputs one received signal. A group of bands of frequencies assigned to these transmitted radio-frequency signals is termed a system band. The received signal from the antenna is entered into the quadrature demodulator 11. In this quadrature demodulator, the mixers 12a and 12b multiply the received signal by local oscillation signals (demodulating carrier signals) having a π/2-(90-degree) phase difference which are produced by the π/2-phase shifter 13 and the local oscillator 14, thereby converting the received signal to two baseband signals having a π/2-phase difference, i.e., quadrature baseband signals.

The quadrature baseband signals are applied to the low-pass filters 15a and 15b adapted to remove interferential waves so as to allow only signals within the system band to pass through and to prevent aliasing. The output signals of the low-pass filters 15a and 15b are applied to the quadrature modulator 16 where they are converted into two intermediate-frequency signals having a π/2-phase difference, i.e., quadrature intermediate-frequency signals, and the two quadrature intermediate-frequency signals are combined into one output signal. The output signal of the quadrature modulator 16 is converted by the A/D converter 21 into a digital signal, which is in turn applied to the digital signal processing unit 22. The digital signal processing unit 22 selects a signal on a desired channel from the input digital signal and recovers original data from the selected signal.

Figure 3:
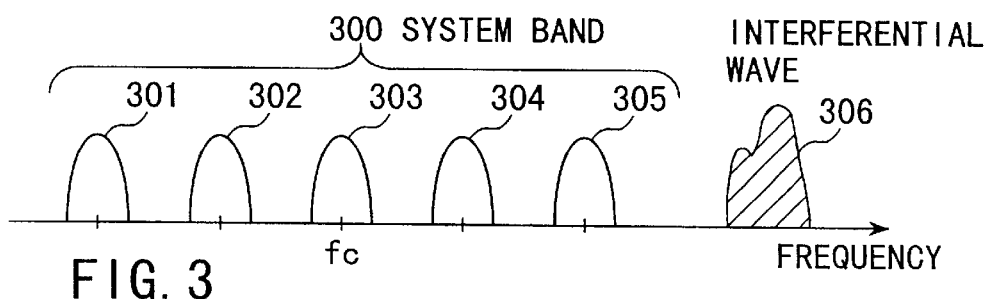
FIG. 3 shows a frequency arrangement in a received signal by the antenna in the first embodiment.

Here, consider the case where radio communication signals having such a frequency allocation as shown in FIG. 3 are received by the antenna 10. The system band 300 shown in FIG. 3 supposes a radio communication system that has five channels 301 to 305 different in carrier frequency. Let the carrier frequency of the channel 303 which is the central channel of the system band be fc. Outside the system band there exists an interferential wave 306. For ease of illustration, the oscillation frequency of the local oscillator 14 in the quadrature demodulator 11 is set to the same frequency as the carrier frequency fc of the central channel 303.

The received signal from the antenna 10 has the same frequency allocation as in FIG. 3. The received signal is frequency-converted by the quadrature demodulator 11 into quadrature baseband signals, i.e., a signal in the baseband as shown in FIG. 4. By this frequency conversion process, the signals on the channels 301 to 305 within the system band 400 in FIG. 3 are converted into signals 401 to 405, respectively, within a system band 400 in FIG. 4. In particular, the signal on the central channel 303 (carrier frequency=fc) in FIG. 3 is converted into the signal on the channel 403 of zero frequency (DC) fo by being mixed with the local oscillation frequency fc from the local oscillator 14.

Figure 4:
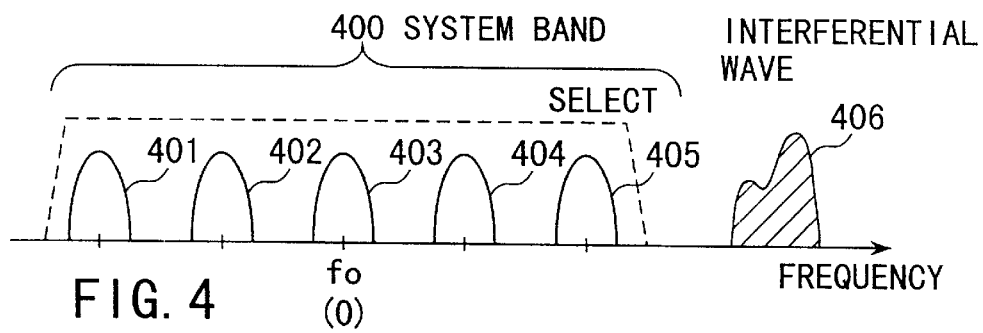
FIG. 4 shows a signal after the second frequency conversion in the receiver in the first embodiment.

The signals in the baseband shown in FIG. 4 from the quadrature demodulator 11 are applied to the low-pass filters 15a and 15b each having a function of eliminating the interference signal 406 outside the system band 400 and a function of having the effect of anti-aliasing on the succeeding A/D converter 21. As a result, only the signals within the system band 400 are selected as indicated by dashed lines. The anti-aliasing is to prevent the occurrence of aliasing distortion due to application to the A/D converter 21 of frequency components of not lower than half of its sampling frequency fs by eliminating frequency components of not lower than fs/2 prior to A/D conversion.

The output signals of the low-pass filters 15a and 15b are inputted to the quadrature modulator 16 where, in the mixers 17a and 17b, they are multiplied by local oscillation signals (modulation carrier signals) having a π/2-phase difference supplied through the π/2-phase shifter 18 from the local oscillator 19 and converted into quadrature intermediate-frequency signals. The quadrature intermediate-frequency signals are then combined in the adder 20 and then outputted.

Figure 5:
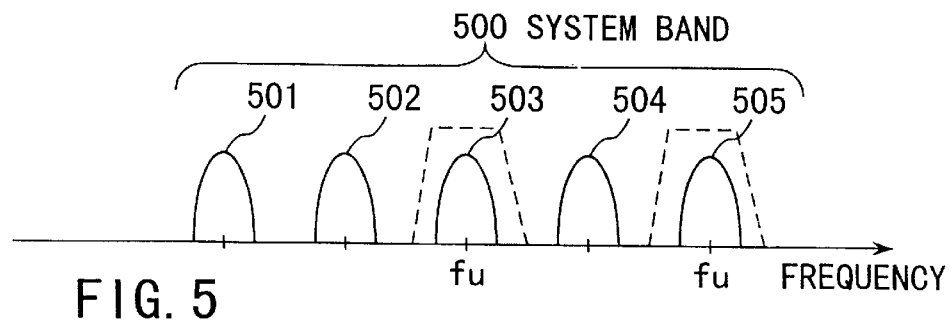
FIG. 5 shows the baseband signal after quadrature demodulation in the receiver in the first embodiment.

FIG. 5 shows a frequency arrangement at the output of the quadrature modulator 16 when the oscillation frequency of the local oscillator 1 is set to fu. As shown, the signal of the frequency fo=0 (DC) on the channel 403 shown in FIG. 4 is converted into a signal 500 of a frequency fu in the intermediate frequency band. The signals on the channels other than the channel 405, for example, the signal on the channel 404 is converted into a signal on the channel 505 which is of an intermediate frequency fu' different from fu. The first and second intermediate-frequency signals outputted from the quadrature modulator 16 are applied to the A/D converter 21 where the intermediate-frequency signals on all the channels 501 to 505 within the system band 500 are converted together into digital signals and then applied to the digital signal processing unit 22.

In the digital signal processing unit 22, as shown in FIG. 2, a desired channel (for example, the channel 503) is selected from among the channels 501 to 505 shown in FIG. 5 by the digital filter 101. The selected signal on the desired channel is demodulated in the demodulator 102, subjected to error correction in the error correction section 103, and decoded in the decoder 104, whereby the original data is recovered.

The advantages of the receiver according to this embodiment will be described next.

Figure 12:
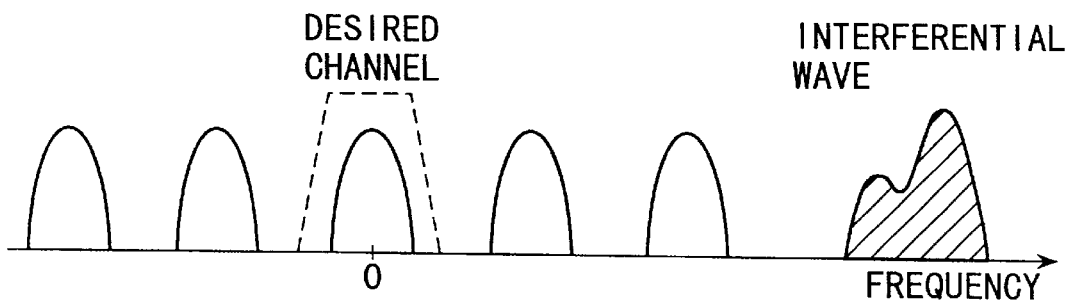
FIG. 12 shows signals in the baseband after quadrature demodulation in a conventional receiver.

In the receiver of this embodiment, first, the signal on a desired channel is selected in the digital signal processing unit 22. This point greatly differs from the conventional direct conversion receiver in which a desired channel is selected by means of an analog low-pass filter as shown in FIG. 12. Thus, the low-pass filters 15a and 15b need only to have such order that the elimination of interferential waves and the prevention of occurrence of aliasing in the A/D converter 21 can be achieved. For this reason, as compared with the low-pass filter used in the direct conversion receiver which has a sharp characteristic requirement for channel selection, the low-pass filters 15a and 15b are allowed to have a wide passband and are therefore easy to implement.

In addition, the receiver of this embodiment is characterized in that the intermediate frequency fu, i.e., the output signal frequency of the quadrature modulator 16, can be set freely according to the oscillation frequency of the local oscillator 19. This provides the receiver with the following advantages.

From the sampling theorem, it is required to set the sampling frequency of the A/D converter 21 to twice or more the intermediate frequency fu. For this reason, the setting of the intermediate frequency fu too high requires the sampling frequency (operating speed) of the A/D converter 21 to be increased. An increase in the sampling frequency results in an increase in the burden on the A/D converter 21. Conversely, the setting of the intermediate frequency fu too low requires the order of the anti-aliasing low-pass filters 15a and 15b to be increased to obtain a sharp characteristic. That is, a heavy burden is imposed on the low-pass filters.

In view of these problems, it is necessary to set the intermediate frequency fu to an optimum value. To allow for a plurality of radio communication systems that differ in frequency and band, the optimum intermediate frequency fu is set such that it differs from system to system.

In this embodiment, simply changing of the oscillation frequency of the local oscillator 19 according to the frequency and band of a radio communication system allows the intermediate frequency fu to be set to the most suitable one to bring each of the operating speed of the A/D converter 301 and the order of the low-pass filters 15a and 15b within a range easy to implement. Thus, the receiver can accommodate flexibly a plurality of radio communication systems. For example, when the local oscillator 19 is formed of a frequency synthesizer, the oscillation frequency can be changed easily.

Moreover, in the present embodiment, since the digital filter 101 in the digital signal processing unit 22 is used for channel selection, the simultaneous selection of signals on two or more channels is made easily. Suppose that two or more channels, such as the channels 503 and 505 in FIG. 5, are desired channels. Unlike the analog low-pass filters 55a and 55b in the conventional direct conversion receiver, the digital filter 101 in this embodiment allows the two or more desired channels to be selected at the same time through its bandpass filtering.

Furthermore, in the digital signal processing unit, the tap coefficients of the digital filter 101 can be varied easily in a programmable manner. Thus, a low-pass filter or bandpass filter can be formed freely as required. That is, since the digital signal processing unit 22 can make channel selection freely through the use of a bandpass filter or low-pass filter for the digital filter 101, the desired channel frequency (intermediate frequency at the input of the A/D converter 21) is allowed to have a relatively high degree of freedom. Further, no stringent frequency management requirement is required of the local oscillator 19 of analog type used in the quadrature modulator 16. Even with a frequency synthesizer, the hardware scale will not increase so much as expected.

The analog type local oscillator 14 in the quadrature demodulator 11 is not required to oscillate at the same frequency as each of the carrier frequencies within the system band, but it is required only to oscillate at a frequency close to a carrier frequency to be received. Thus, the oscillator is easy to implement. The reason is described below.

Although, in FIG. 3, the oscillation frequency of the local oscillator 14 is set to fc for ease of description, in practice it is only required to be set to a frequency close to the carrier frequency fc, and it is not necessarily required to match exactly any of the carrier frequencies of the five channels. This owes to the cascade arrangement of the quadrature demodulator 11 and the quadrature modulator 16.

That is, the oscillation frequency of the local oscillator 14 is required to lie within a range that allows the $\pi/2$-phase shifter 13 in the quadrature demodulator 11 to output correctly two signals having a $\pi/2$-phase difference at a frequency close to the carrier frequency fc and the $\pi/2$-phase shifter 18 in the quadrature modulator 16 to output correctly two signals having a $\pi/2$-phase difference within the system band 400 for the baseband frequency fo in FIG. 4. This allows the frequency conversion operation of each of the mixers 12a and 12b in the quadrature demodulator 11 and the mixers 17a and 17b in the quadrature modulator 16 to suppress fully image signals. Thus, the local oscillator 14 can be implemented easily because its oscillation frequency does not need to be set strictly.

[Second Embodiment]

Figure 6:
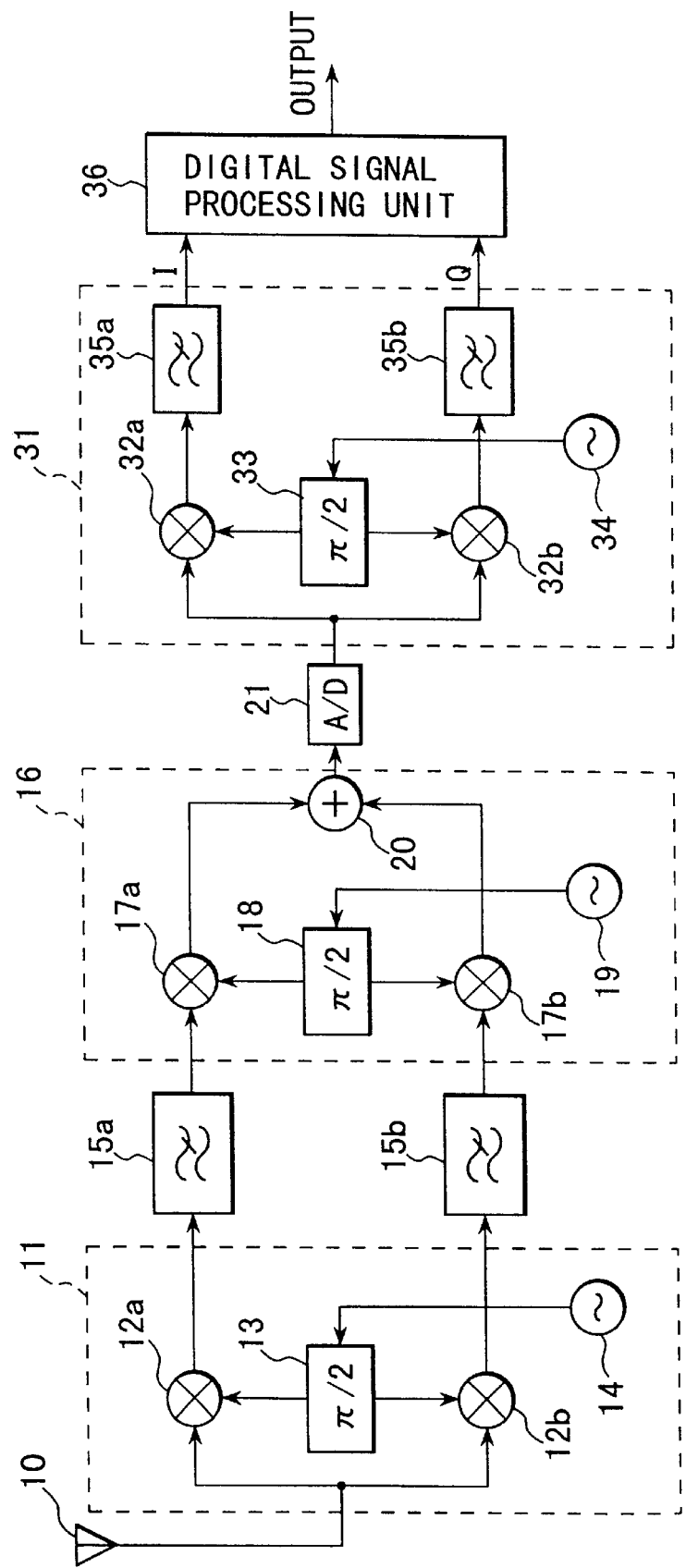
FIG. 6 is a block diagram of a receiver according to a second embodiment of the present invention.

FIG. 6 shows the arrangement of a receiver according to a second embodiment of the present invention. In this figure, like reference numerals are used to denote corresponding components to those in FIG. 1. The second embodiment is distinct from the first embodiment in that a digital signal from the A/D converter 21 is inputted through a digital downconverter 31 to a digital signal processing unit 36.

The digital downconverter 31, which is composed of digital mixers 32a and 32b, a digital $\pi/2$-phase shifter 33, a reference clock generator 34, and digital filters 35a and 35b, performs quadrature demodulation on a digital input signal from the A/D converter 21, makes a channel selection, and passes the selected channel signal on to the digital processing unit 36.

More specifically, in the downconverter, the digital input signal from the A/D converter 21 is multiplied by two reference clock signals having a $\pi/2$-phase difference supplied through the digital $\pi/2$-phase shifter 33 from the reference clock generator 34 and converted into two digital signals having a $\pi/2$-phase difference, i.e., quadrature digital signals, and the quadrature digital signals are inputted through the digital filters 35a and 35b to the digital signal processing unit 36.

Figure 7:
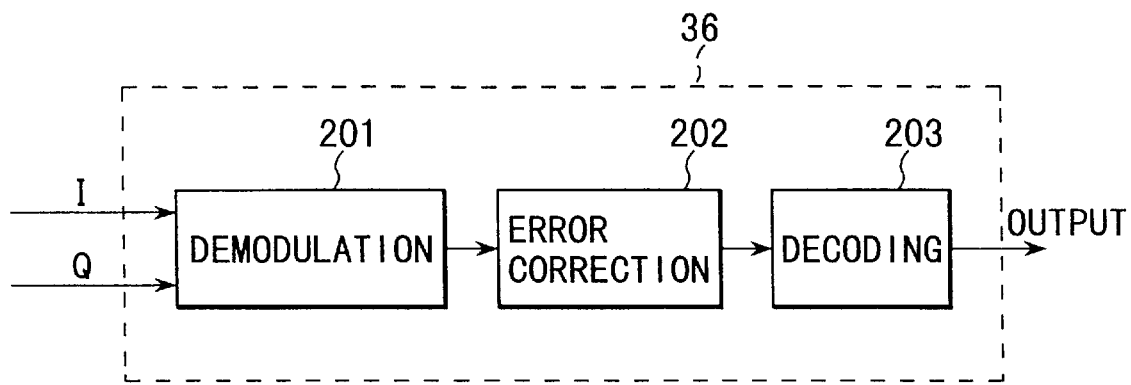
FIG. 7 is a block diagram of the digital signal processing section of FIG. 6.

In this embodiment, the channel selection is made by the digital downconverter 31. Thus, no digital filter for channel selection is required in the digital signal processing unit 36, which is composed of a demodulation section 201, an error correction section 202, and a decode section 203 as shown in FIG. 7. This arrangement is especially effective in the case where the digital signal processing unit 36 is implemented by a digital signal processor (DSP).

Incorporation of functions of quadrature. demodulation, channel selection, and frequency synthesis into a DSP generally requires an enormous amount of processing, which makes it difficult for the DSP to perform a real-time operation. It is therefore desirable that, as in this embodiment, the functions of quadrature demodulation, channel selection and frequency synthesis be implemented as hardware by the digital downconverter 31 and the other processes of demodulation, error correction and decoding be implemented by the digital signal processing unit 36. For example, the Harris HSP50016 is commercially available as a digital downconverter, which can be used as the digital downconverter 31 in FIG. 6.

Thus, this embodiment allows required parameters for demodulation to be easily made variable by software in the digital signal processing unit 36 and allows the functions of quadrature demodulation, channel selection, and frequency synthesis to be performed easily in real time by the digital downconverter 31 implemented in hardware.

[Third Embodiment]

Figure 8:
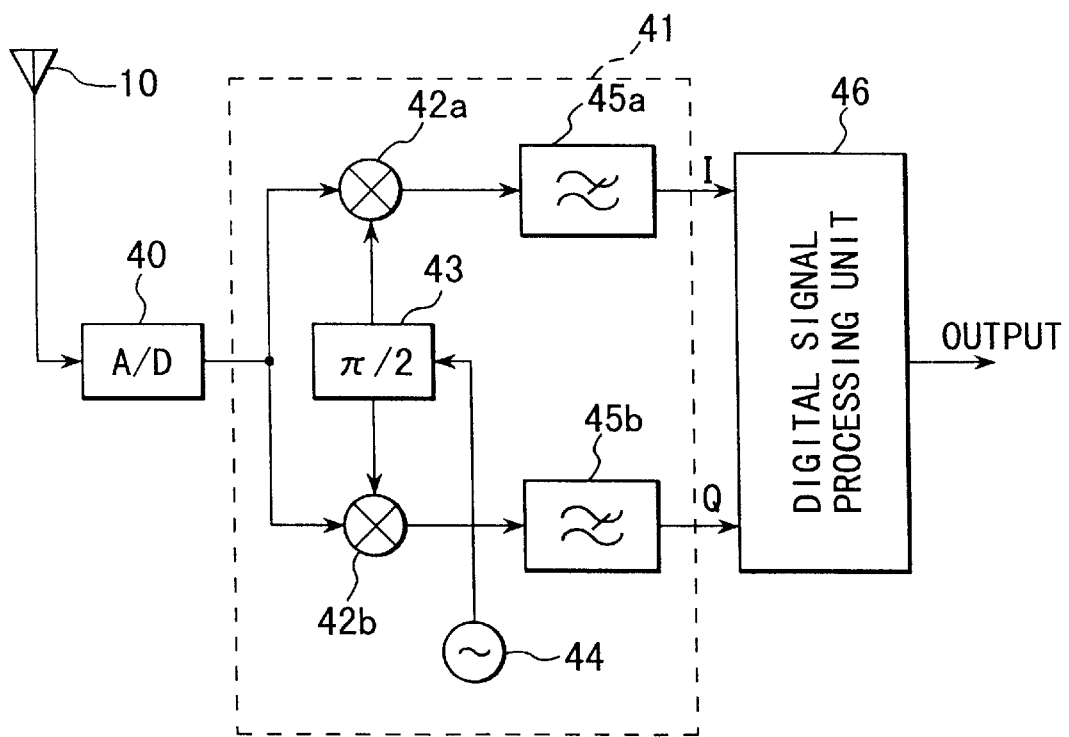
FIG. 8 is a block diagram of a receiver according to a third embodiment of the present invention.

FIG. 8 shows the arrangement of a receiver according to a third embodiment of the present invention. In this embodiment, the quadrature demodulator 11 and the quadrature modulator 16 in the second embodiment are removed. A received signal from the antenna 10 is amplified by an amplifier not shown and converted into a digital signal by an A/D converter 40 into a digital signal, which in turn is applied to a digital downconverter 41. Like the digital downconverter 31 in FIG. 6, the digital downconverter 41 is constructed from digital mixers 42a and 42b, a digital $\pi/2$-phase shifter 43, a reference clock generator 44, and digital filters 45a and 45b. In the digital downconverter 41, a digital signal from the A/D converter 40 is subjected to quadrature modulation for downconversion of the signal frequency and a signal on a desired channel is then selected.

The output signal of the digital downconverter 41 is entered into a digital signal processing unit 46 which, like the digital signal processing unit 36 in the second embodiment, is constructed as shown in FIG. 7.

According this embodiment, a received signal of a radio frequency from the antenna 10 is directly converted into a digital signal in the A/D converter 40 and then directly inputted to the digital converter 41. Thus, the digital downconverter 41 is allowed to operate faster than the downconverter 31 in the second embodiment. The third embodiment remains unchanged from the second embodiment in the other respects.

[Fourth Embodiment]

Figure 9:
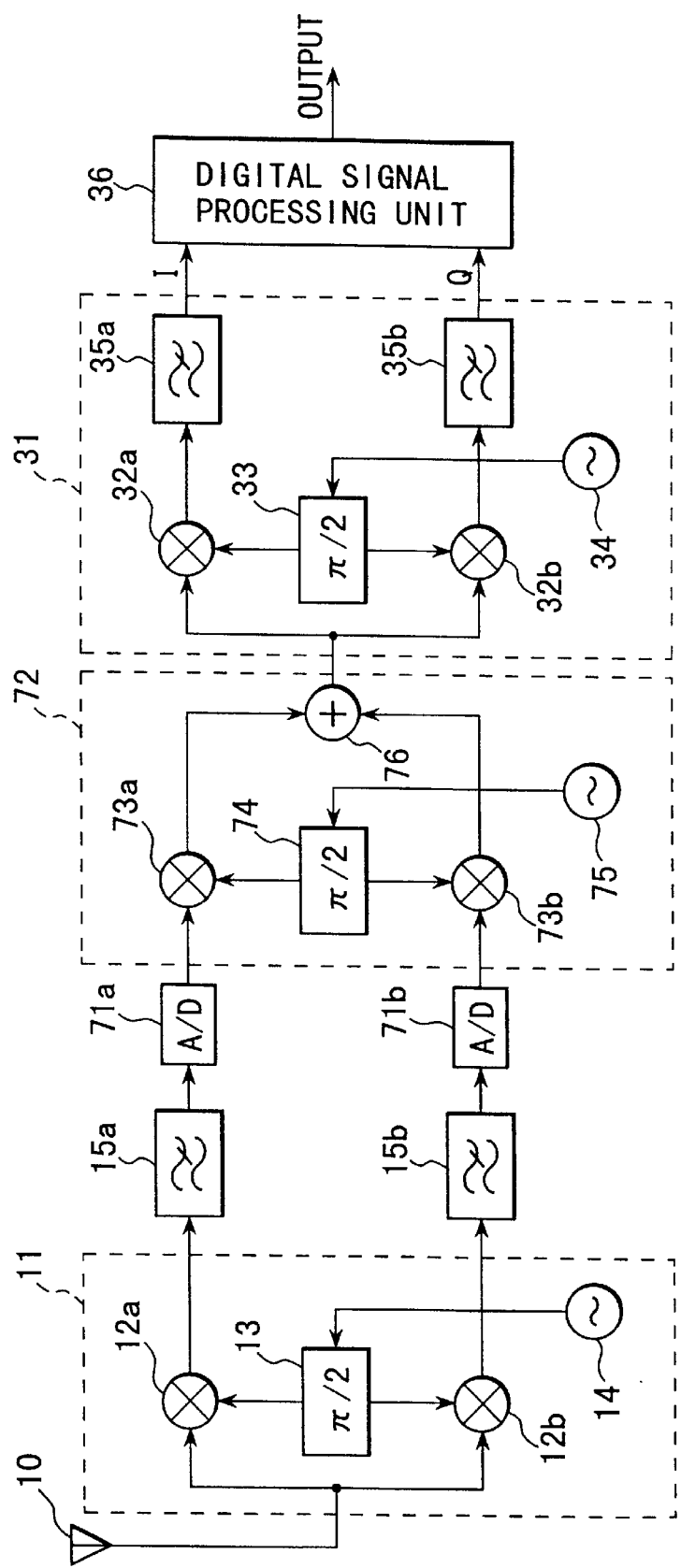
FIG. 9 is a block diagram of a receiver according to a fourth embodiment of the present invention.

FIG. 9 shows the arrangement of a receiver according to a fourth embodiment of the present invention. This embodiment is similar to the second embodiment shown in FIG. 6. Thus, like reference numerals are used to denote corresponding components to those in FIG. 6 and only differences will be described mainly.

This embodiment is basically different from the second embodiment in that the A/D converter 21 in the second embodiment is removed and instead two A/D converters 71a and 71b are inserted between low-pass filter 15a and quadrature modulator 16 and between low-pass filter 15b and quadrature modulator 16, respectively. Correspondingly the analog type quadrature modulator 16 in FIG. 6 is replaced with a digital type of quadrature modulator 72.

The digital quadrature modulator 72 comprises digital mixers 73a and 73b, a π/2-phase shifter 74, a reference clock generator 75, and an adder 76. The digital mixers 73a and 73b are supplied as local signals with reference clock signals which are generated from the reference clock generator 75 which have a phase difference of π/2 introduced by the π/2-phase shifter 74, thereby outputting quadrature intermediate-frequency signals, i.e., two intermediate-frequency digital signals having a phase difference of π/2.

In the arrangement of FIG. 6, received signals (quadrature baseband signals) converted to baseband signals by the quadrature demodulator 11 are upconverted into quadrature intermediate-frequency signals by the analog type quadrature modulator 16, and the intermediate-frequency signals are then digitized by the A/D converter 21. In contrast, in this embodiment, the quadrature baseband signals from the quadrature demodulator 11 are first converted into digital signals by the A/D converters 71a and 71b and then have their frequency upconverted to the intermediate frequency by the digital quadrature modulator 72 to produce quadrature intermediate-frequency signals.

Thus, in this embodiment, the quadrature modulator 16 of analog type in FIG. 6 can be implemented by the quadrature modulator 72 of digital type. Thereby, the burden on the analog circuit portion can be eliminated without losing any of the advantages described in connection with FIG. 6. Owing to replacement of an analog circuit with a digital circuit, advantages that the influence of secular changes is reduced and the influence of variations in circuit constant is eliminated are obtained anew.

Whereas one A/D converter is used in FIG. 6, two A/D converters are used in this embodiment, which may give the impression that apparently the hardware scale increases. The conversion speed of the A/D converters 71a and 71b is allowed to be half of that of the A/D converter 21 in the second embodiment because they are only required to convert a baseband signal from the quadrature demodulator 11 to a digital signal. For example, the use of a single A/D converter having the same conversion speed as the A/D converter 21 in the second embodiment and the parallel operation of it as the A/D converters 71a and 71b allow for A/D conversion for I and Q channels. In this case, the burden on the A/D converter becomes equal to or smaller than that in the second embodiment. Thus, the specification for the A/D converter will not become more stringent than in the second embodiment.

Figure 10A:
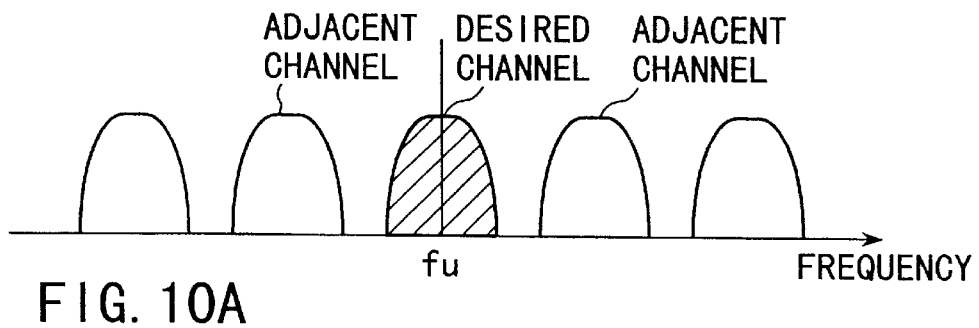
FIGS. 10A and 10B are diagrams for use in explanation of a desirable way of selecting the oscillation frequency of the local oscillator in the quadrature modulator in the receiver according to the second and fourth embodiments of the present invention.

In the second and fourth embodiments, from a reception characteristic viewpoint it is desirable to select the oscillation frequency of the local oscillator 1 in the quadrature modulator in FIG. 6 and the oscillation frequency of the reference clock generator 75 in the digital quadrature modulator 72 in the following manner: When, as shown in FIG. 10A, the oscillation frequency fu of the local oscillator 19 or the reference clock generator 75 comes in the band of a desired channel that is finally selected by the digital downconverter 31, their output signal locally leaks in the signal on the desired channel, which may degrade the reception characteristic.

The effect of local leak can be circumvented by setting the oscillation frequency of the local oscillator 19 or the reference clock generator 75 to a frequency outside the band of the desired channel. When a desired channel is predetermined, it is recommended that the oscillation frequency of the local oscillator 19 or the reference clock generator 75 be set to a frequency outside the band of the desired channel, for example, the frequency fu in FIG. 10B.

Figure 10B:
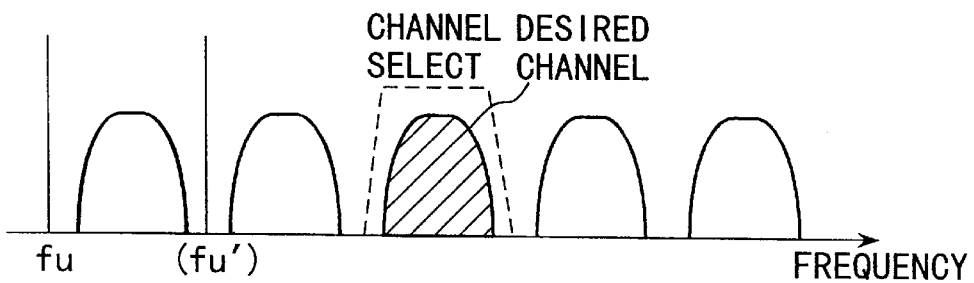

When there are a plurality of desired channels, it is recommended that the oscillation frequency of the local oscillator 19 or the reference clock generator 75 be set to a frequency between the bands of the desired channels, for example, the frequency fu' in FIG. 10B.

[Fifth Embodiment]

Figure 11:
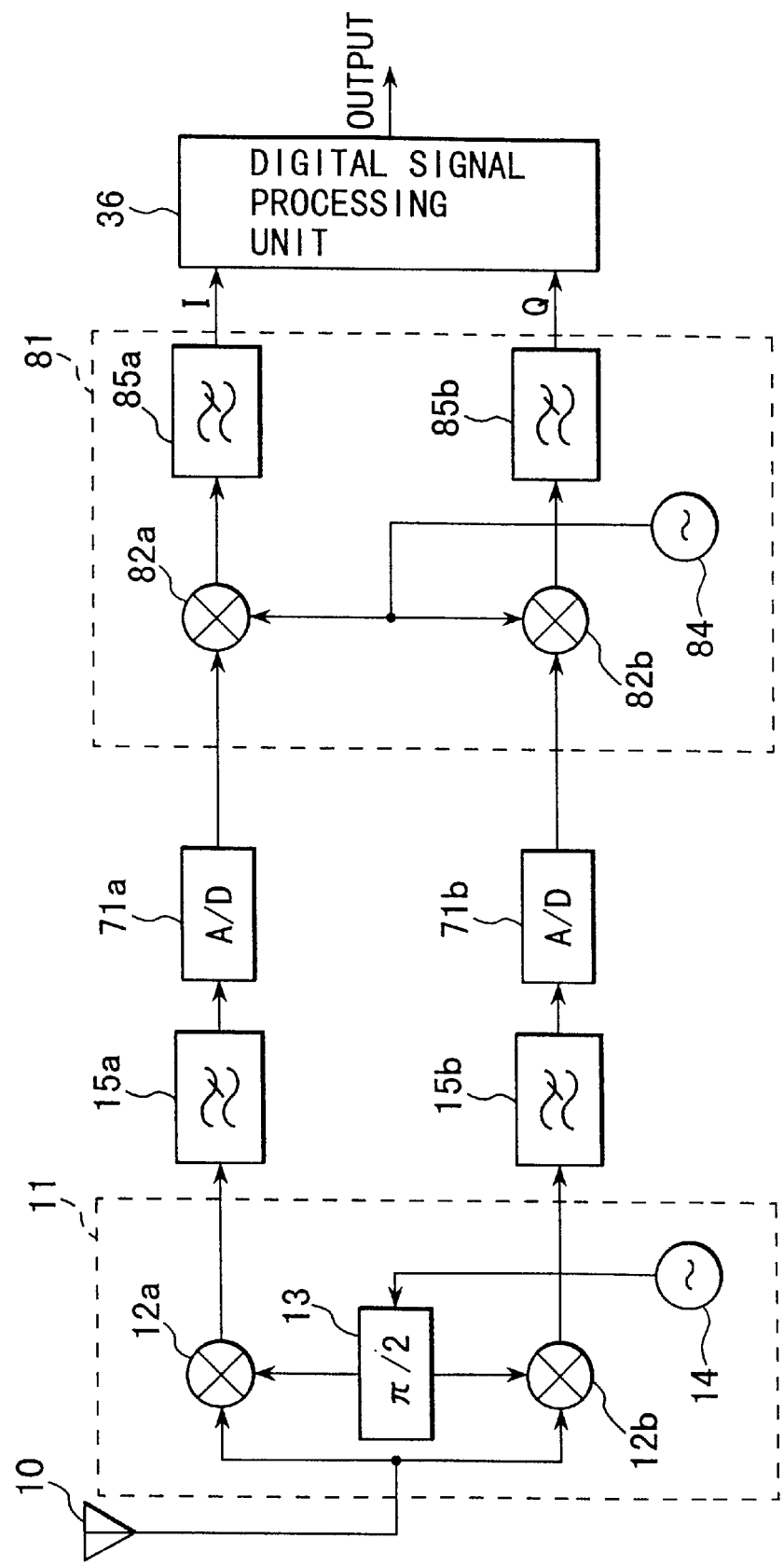
FIG. 11 is a block diagram of a receiver according to a fifth embodiment of the present invention.

FIG. 11 shows the arrangement of a receiver according to a fifth embodiment of the present invention. This embodiment is similar to the fourth embodiment shown in FIG. 9. Thus, like reference numerals are used to denote corresponding components to those in FIG. 9 and only differences will be described mainly.

As shown in FIG. 11, in this embodiment, the quadrature modulator 72 in FIG. 9 is removed so that I- and Q-channel output signals from the A/D converters 71a and 71b are directly inputted to the digital mixers 82a and 82b in the digital downconverter 81. In the digital downconverter 81, unlike those in FIGS. 6 and 9, the reference clock signals supplied from the reference clock generator 84 to the digital mixers 82a and 82b as local signals are in phase with each other. Thus, the π/2-phase shifter 33 required in the digital downconverter 31 shown in FIGS. 6 and 9 becomes unnecessary.

In this embodiment, unlike the fourth embodiment, there is no need of the quadrature modulator 72, allowing the circuit scale to be reduced. That is, in the fourth embodiment shown in FIG. 9, I- and Q-channel received signals converted into baseband signals by the quadrature demodulator 11 are subjected in sequence to A/D conversion in the A/D converters 71a and 71b, upconversion to intermediate-frequency signals in the quadrature modulator 72, and quadrature demodulation and channel selection in the digital downconverter 31.

In contrast, this embodiment applies the I- and Q-channel baseband signals directly to the digital mixers 82a and 82b, respectively, in the digital downconverter 81 after A/D conversion in the A/D converters 21a and 21b, allowing channel selection in the digital downconverter 81 with the quadrature modulator 72 omitted.

Next, the principle of demodulation in this embodiment will be described.

Suppose that, as shown in FIG. 3, the received signal from the antenna 10 contains a plurality of channels (in the example shown, five channels: 301 to 305) having different carrier frequencies within the system band 300. In the analog mixers 12a and 12b in the quadrature demodulator 11, the received signal is multiplied by the quadrature local signals from the local oscillator 14 that oscillates at the same frequency as the carrier frequency of the central channel 303 of the system band 300 and as a result it is subjected to quadrature demodulation.

By quadrature demodulation, the received signal is converted into I- and Q-channel signals of fo=0 frequency (DC) as shown in FIG. 4. When viewed from the input of the quadrature demodulator 11, the I- and Q-channel signals are baseband signals, but in practice they contain signals on two or more channels. Namely, at this stage, channel selection is not made yet. In the second embodiment shown in FIG. 6 and the fourth embodiment shown in FIG. 9, after upconversion of the baseband signals that contain two or more channel signals to the intermediate-frequency band by the quadrature modulator 16 or 72 prior to channel selection, quadrature demodulation (frequency conversion) and channel selection are performed in the digital downconverter 31.

This embodiment, as it were, considers the baseband signals from the quadrature demodulator 11 to be I- and Q-channel intermediate-frequency signals containing two or more channel signals and performs frequency conversion to baseband signals and channel selective filtering in the digital downconverter 81 by inputting the intermediate-frequency signals directly to the digital mixers 82a and 82b. That is, although, in the output signals of the quadrature demodulator 11, only the signal on the central channel 303 (carrier frequency fc) has been converted to a signal of zero frequency, in this embodiment only a signal on a desired channel is converted to a zero-frequency signal in the digital downconverter 81.

It should be noted in this connection that, whereas, in the second and fourth embodiments, the local signals (reference clock signals) supplied to the digital mixers 32a and 32b in the digital downconverter 31 are quadrature signals having a phase difference of 90 degrees, in the present embodiment the local signals supplied to the digital mixers 82a and 82b in the digital downconverter 81 are made to be in phase with each other in order to maintain the orthogonality of the I- and Q-channel signals outputted from the digital downconverter.

Various modifications of the present invention are possible, as follows:

(1) The low-pass filters 15a and 15b shown in FIGS. 1, 6, 9, and 11 need not necessarily to allow all the channel signals within the system band to pass through, but they may have a function of rejecting some unwanted channels. In this case, it is possible to set the oscillation frequency of the local oscillator 14 in the quadrature demodulator 11 close to the frequency of a desired channel. By so doing, the frequency of the desired channel can be made low in the digital signal processing unit 22 in FIG. 1, the digital downconverter 31 in FIGS. 6 and 9, and the digital down converter 81 in FIG. 11, which advantageously facilitates processing.

(2) The low-pass filters in FIGS. 1, 6, and 11 may be arranged so that their passband can be varied. This arrangement is effective in the case where radio communications systems intended for reception have difference system bands.

(3) To reject harmonic components generated in the quadrature modulator 16 as required, a bandpass or low-pass filter having a relatively wideband may be inserted to precede the A/D converter 21 in FIGS. 1 and 6.

(4) As an evolved form of the basic arrangement of the present invention, an arrangement is possible in which a received signal from an antenna is directly converted into a digital signal by an A/D converter and the digital signal is directly inputted to a digital signal processing unit for channel selection and demodulation. In that case, the digital signal processing unit may have a function of digital downconversion.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A receiver adaptable to a plurality of radio communication systems comprising:

a radio-frequency signal reception unit which collectively receives radio-frequency signals on a plurality of channels each of which is modulated with data;

a quadrature demodulator which multiplies each of the radio-frequency signals by a first local signal to produce a first baseband signal, and multiplies each of the radio-frequency signals by a second local signal having a $\pi/2$-phase differs from the first local signal to produce a second baseband signal having a $\pi/2$-phase differs from the first baseband signal;

a first low-pass filter which outputs a first low-frequency component signal from the first baseband signal;

a second low-pass filter which outputs a second low-frequency component signal from the second baseband signal;

a quadrature modulator which multiplies the first low-frequency component signal by a third local signal to produce a first intermediate-frequency signal, multiplies the second low-frequency component signal by a fourth local signal having a $\pi/2$-phase differs from the third local signal to produce a second intermediate-frequency signal, and combines the first intermediate-frequency signal and the second intermediate-frequency signal into an output signal;

an A/D converter which converts the outputs signal into a digital signal;

a digital downconverter which multiplies the digital signal by a first clock signal to produce a first digital baseband signal, multiplies the digital signal by a second clock signal having a $\pi/2$-phase differs from the first clock signal to produce a second digital baseband signal having a $\pi/2$-phase differs from the first baseband signal and selects a signal on at least one channel from the first digital baseband signal, selects a signal on at least one channel from the second digital baseband signal;

a digital signal processing unit which processes the first digital baseband signal and second digital baseband signal to recover the data.

2. The receiver according to claim 1, wherein the first low-pass filter is adapted to reject interferential components contained in the first baseband signal and prevent the occurrence of aliasing due to sampling in the A/D converter, and the second low-pass filter is adapted to reject interferenctial components contained in the second baseband signal and prevent the occurrence of aliasing due to sampling in the A/D converter.

3. The receiver according to claim 1, wherein the digital downconverter includes a first digital filter that selects the signal on at least one channel from the first digital baseband signal and a second digital filter that selects the signal on at least one channel from the second digital baseband signal.

4. The receiver according to claim 1, wherein the digital signal processing unit includes a demodulator which demodulates a selected signals by the digital downconverter, and a decoder which decodes a demodulated signal to recover the data.

5. A receiver adaptable to a plurality of radio communication systems, comprising:
   a radio-frequency signal reception unit that collectively receives radio-frequency signals on a plurality of channels, each radio-frequency signal being modulated with data;
   a quadrature demodulator unit that multiplies each of the radio-frequency signals by a first local signal to produce a first baseband signal, and multiplies each of the radio-frequency signals by a second local signal, having a $\pi/2$-phase difference from the first local signal, to produce a second baseband signal, having a $\pi/2$-phase difference from the first baseband signal;
   a first low-pass filter unit that outputs a first low-frequency component signal from the first baseband signal;
   a second low-pass filter unit that outputs a second low-frequency component signal from the second baseband signal;
   at least one A/D converter unit that converts the first low-frequency component signal and the second low-frequency component signal into a digital signal; and
   a digital signal processing unit that selects a signal based on a desired one of the channels from the digital signal, and processes the signal to recover the data, wherein the digital signal processing unit includes,
   a quadrature modulator unit that multiplies the first low-frequency component signal by a third local signal to produce a first intermediate-frequency signal, multiplies the second low-frequency component signal by a fourth local signal, having a $\pi/2$-phase difference from the third local signal, to produce a second intermediate-frequency signal, and combines the first intermediate-frequency signal and the second intermediate-frequency signal into an output signal,
   a digital downconverter unit that multiplies the output signal by a first clock signal to produce a first digital baseband signal, multiplies the output signal by a second clock signal, having a $\pi/2$-phase difference from the first clock signal, to produce a second digital baseband signal, having $\pi/2$-phase difference from the first baseband signal, and selects a signal on at least one channel from the first digital baseband signal and selects a signal on at least one channel from the second digital baseband signal, and
   a digital signal processor unit that processes the first digital baseband signal and second digital baseband signal to recover the data.

6. The receiver according to claim 5, wherein the first low-pass filter unit is adapted to reject interferential components contained in the first baseband signal and prevents the occurrence of aliasing due to sampling in the A/D converter unit, and the second low-pass filter unit is adapted to reject interferential components contained in the second baseband signal and prevents the occurrence of aliasing due to sampling in the A/D converter unit.

7. The receiver according to claim 5, wherein the digital signal processor unit includes a demodulator unit that demodulates a selected signal by the digital downconverter, and a decoder unit that decodes a demodulated signal to recover the data.

8. A receiver adaptable to a plurality of radio communication systems, comprising:
   a radio-frequency signal reception unit that collectively receives radio-frequency signals on a plurality of channels, each radio-frequency signal being modulated with data;
   a quadrature demodulator unit that multiplies each of the radio-frequency signals by a first local signal to produce a first baseband signal, and multiplies each of the radio-frequency signals by a second local signal, having a $\pi/2$-phase difference from the first local signal, to produce a second baseband signal, having a $\pi/2$-phase difference from the first baseband signal;
   a first low-pass filter unit that outputs a first low-frequency component signal from the first baseband signal;
   a second low-pass filter unit that outputs a second low-frequency component signal from the second baseband signal;
   at least one A/D converter unit that converts the first low-frequency component signal and the second low-frequency component signal into a digital signal; and
   a digital signal processing unit that selects a signal based on a desired one of the channels from the digital signal, and processes the signal to recover the data, wherein the digital signal processing unit includes,
   a digital downconverter unit that multiplies the first low-frequency component signal and the second low-frequency component signal from the A/D converter unit by a common clock signal to produce a first digital baseband signal and a second digital baseband signal, having a $\pi/2$-phase difference from the first baseband signal, and selects a signal on at least one channel from the first digital baseband signal and selects a signal on at least one channel from the second digital baseband signal, and
   a digital signal processor unit that processes the first digital baseband signal and second digital baseband signal to recover the data.

9. The receiver according to claim 8, wherein the digital signal processor unit includes a demodulator unit that demodulates the selected signal by the digital downconverter, and a decoder unit that decodes the demodulated signal to recover the data.

10. The receiver according to claim 8, wherein the first low-pass filter unit is adapted to reject interferential components contained in the first baseband signal and prevents the occurrence of aliasing due to sampling in the A/D converter unit, and the second low-pass filter unit is adapted to reject interferential components contained in the second baseband signal and prevents the occurrence of aliasing due to sampling in the A/D converter unit.

* * * * *